United States Patent [19]
Rhodes

[11] Patent Number: 4,809,301
[45] Date of Patent: Feb. 28, 1989

[54] DETECTION APPARATUS FOR BI-PHASE SIGNALS

[75] Inventor: Melvin H. Rhodes, Cedar Rapids, Iowa

[73] Assignee: The United States of America as represented by the Secretary of the Air Force, Washington, D.C.

[21] Appl. No.: 128,006

[22] Filed: Nov. 25, 1987

[51] Int. Cl.4 ............................................. H03D 3/22
[52] U.S. Cl. ..................................... 375/87; 360/43; 329/112
[58] Field of Search ............ 375/55, 87; 340/347 DD; 360/42, 43; 329/112

[56] References Cited

U.S. PATENT DOCUMENTS

| | | | |
|---|---|---|---|
| 3,659,286 | 4/1972 | Perkins et al. | 375/55 |
| 4,185,273 | 1/1980 | Gowan | 375/87 |
| 4,313,206 | 1/1982 | Woodward | 375/110 |
| 4,320,525 | 3/1982 | Woodward | 375/110 |
| 4,468,791 | 8/1984 | Masek | 375/87 |
| 4,503,472 | 3/1985 | Lacher | 360/43 |
| 4,525,848 | 6/1985 | Simpson | 375/87 |
| 4,531,223 | 7/1985 | Ashida | 375/110 |
| 4,542,420 | 9/1985 | Kozlik et al. | 360/42 |
| 4,603,322 | 7/1986 | Blair | 340/347 DD |
| 4,675,884 | 6/1987 | Nakamura et al. | 375/87 |

Primary Examiner—Robert L. Griffin
Assistant Examiner—Stephen Chin
Attorney, Agent, or Firm—Donald J. Singer; William Stepanishen

[57] ABSTRACT

A bi-phase signal detection apparatus having a milti-tapped delay line to delay a coded input signal. A polarity change in the input signal loads the signal on each delay tap into a parallel shift register. A subsequent delayed polarity change will apply the shift register signals into the decode logic circuit which determines the output signals.

5 Claims, 3 Drawing Sheets

DETECTION APPARATUS FOR BI-PHASE SIGNALS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a signal detection circuit and in particular to a digital detection apparatus for bi-phase signals.

The state of the art of signal detection and recovery apparatus is well represented and alleviated to some degree by the prior art apparatus and approaches which are contained in the following U.S. patents: U.S. Pat. No. 4,531,223 issued to Ashida on 23 July 1985; U.S. Pat. No. 4,468,791 issued to Masek on 28 August 1984; U.S. Pat. No. 4,320,525 issued to Woodward on 16 March 1982; and U.S. Pat. No. 4,313,206 issued to Woodward on 26 January 1982.

The early prior art approach to signal recovery or detection is shown in the above-referenced prior art patents. The Ashida patent is directed towards a clock derivation system for deriving clock information from a Manchester code or the like having a base band of twice the clock frequency. The Masek patent illustrates a method for decoding a received bi-phase-coded signal. A signal edge (2) is detected and its polarity is determined in intervals of two periods (2T) for reconstructing the transmitted data. This allows the transmission rate of the signals to be increased up to the maximum frequency limit of the logic family used.

The Woodward patent (U.S. Pat. No. 4,313,206) discloses a circuit arrangement for extracting clocking signals from double frequency waveforms in which transitions from an incoming waveform are detected by comparing the output of a first delay line tap with the incoming waveform and simultaneously comparing the outputs of second and third delay line taps thereby generating first and second waveforms used to form a composite clock.

Another Woodward patent (U.S. Pat. No. 4,320,525) discloses a digital circuit for reconstructing the timing information encoded within digital waveforms of the double frequency class which includes facilities for restoring the circuit to proper synchronization at start up time or after a burst of noise of an incoming waveform.

The present invention is directed to a detection apparatus that decodes bi-phase-L (also called Manchester Code), bi-phase-M or bi-phase-S digital signals. It also recovers the clock and detects certain non-Manchester codes. A description of the different bi-phase-L-phase coding techniques are described in a handbook INTERFACE by Kenneth M. True which was published by Fairchild Semiconductor, 464 Ellis St., Mountain View, Calif. 94042.

SUMMARY OF THE INVENTION

The present invention utilizes a digital network that decodes bi-phase-L (also called Manchester code), bi-phase-M or bi-phase-S digital signals and recovers the clock and detects certain Non-Manchester codes. The bi-phase signal detection apparatus uses a tapped delay line in combination with a parallel shift register and combinational logic to determine the signal pulse widths in order to decode the signal. One main advantage of this circuit is that it requires no synchronization of a clock to recover the signal.

It is one object of the present invention, therefore, to provide an improved bi-phase signal detection apparatus.

It is another object of the invention to provide an improved bi-phase signal detection apparatus that requires no clock synchronization to recover a coded signal.

It is a further object of the invention to provide an improved bi-phase signal detection apparatus which decodes bi-phase-L, bi-phase-M or bi-phase-S digital signals.

It is still another object of the invention to provide an improved bi-phase signal detection apparatus which recovers the clock signal and detects certain non-Manchester codes.

It is yet another object of the invention to provide an improved bi-phase signal detection apparatus that utilizes a parallel shift register and combinational logic to decode the coded signal.

These and other advantages, objects and features of the invention will become more apparent after considering the following description taken in conjunction with the illustrative embodiment in the accompanying drawings.

DETAILED DESCRIPTION OF THE PREFERRED EMBODIMENT

Figure 1:
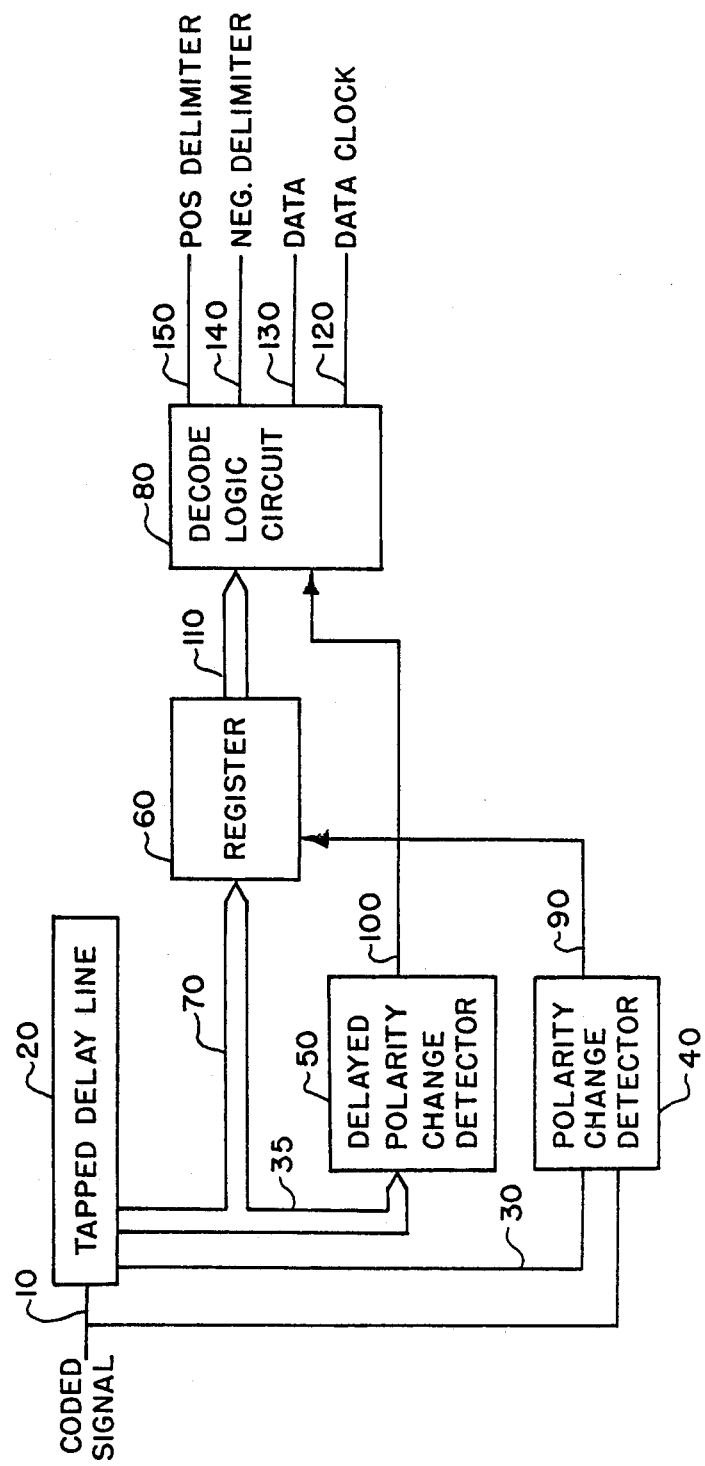
FIG. 1 is a block diagram of the bi-phase signal detection apparatus according to the present invention.

Referring now to FIG. 1, there is shown a block diagram of the bi-phase signal detection apparatus. A bi-phase coded input signal 10 is applied directly to a multi-tapped delay line unit 20, and a polarity change detector unit 40. The signals on the multi-taps 70 from the delay line unit 20 are applied to the parallel shift register 60 with one tap 30 also going to the polarity change detector unit 40 and two other taps 35 going to the delayed polarity change detector unit 50. The multiple output signals 110 from the parallel shift register unit 60 are connected to the logical decode unit 80. The logical decode unit 80 generates a clock output signal 120, the data output 130, a negative delimiter pulse 140 and a positive delimiter pulse 150.

Figure 2:
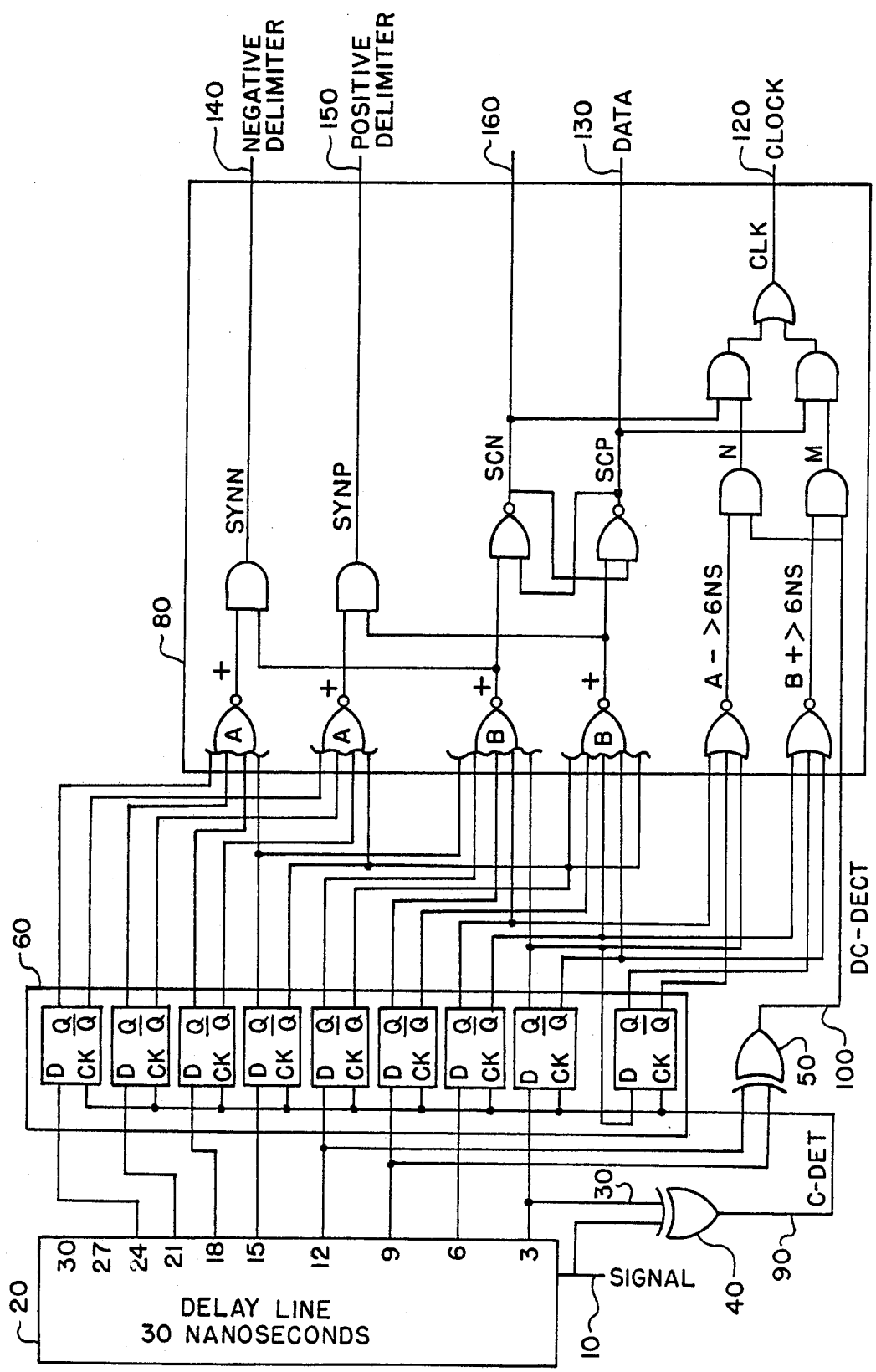
FIG. 2 is a logical block diagram of the bi-phase decoder apparatus.

Turning now to FIG. 2, there is shown a logical block diagram of the bi-phase decoder apparatus illustrating a Manchester decoder for 50 megbit/sec. In the following example, the tapped delay line unit 20 provides a total delay of 30 nanoseconds in 3 nanosecond increments. The polarity change detector unit 40 and the delayed polarity change detector unit 50 may each comprise a two input exclusive-or logic gate. The parallel shift register unit 60 comprises a plurality of flip-flops to process data thereto in parallel. The logical decoder unit 80 comprises a plurality of logic gates to decode the coded signal thereto.

The bi-phase decoder apparatus operates in the following manner. When input signal 10 changes polarity, the signal 30 because of the time delay of the tap will be of opposite polarity. During this short period the output 90 of the Exclusive Or gate 40 will be a pulse which will load the signals from each tap of the delay line unit into the parallel shift register unit 60. The register output signals and the delayed polarity change detector signal 100 are then applied to the combinational logic unit 80 which then determines the output signals.

After a pulse from the polarity change detector unit 40, the logic for the output signals is as follows:

1. If the signal input was positive for more than $\frac{1}{2}$ bit period then there was a change in the signal polarity from a negative to a positive value and the Data output will be a "one".
2. If the signal input was negative for more than $\frac{1}{2}$ bit period then there was a change in the signal polarity from a positive value to a negative value and the Data output will be a "zero".
3. If the signal input has been positive for more than one bit period then this will indicate a positive delimiter signal or an error.
4. If the signal input has been negative for more than one bit period than this will indicate a negative delimiter signal or an error.
5. If the signal input has been positive for more than $\frac{1}{4}$ bit time and the last change and the data output was also negative then a clock pulse will occur when the signal 100 from the delayed polarity detector is positive. The delayed pulse will occur about $\frac{1}{4}$ bit time after the pulse 90.

Figure 3:
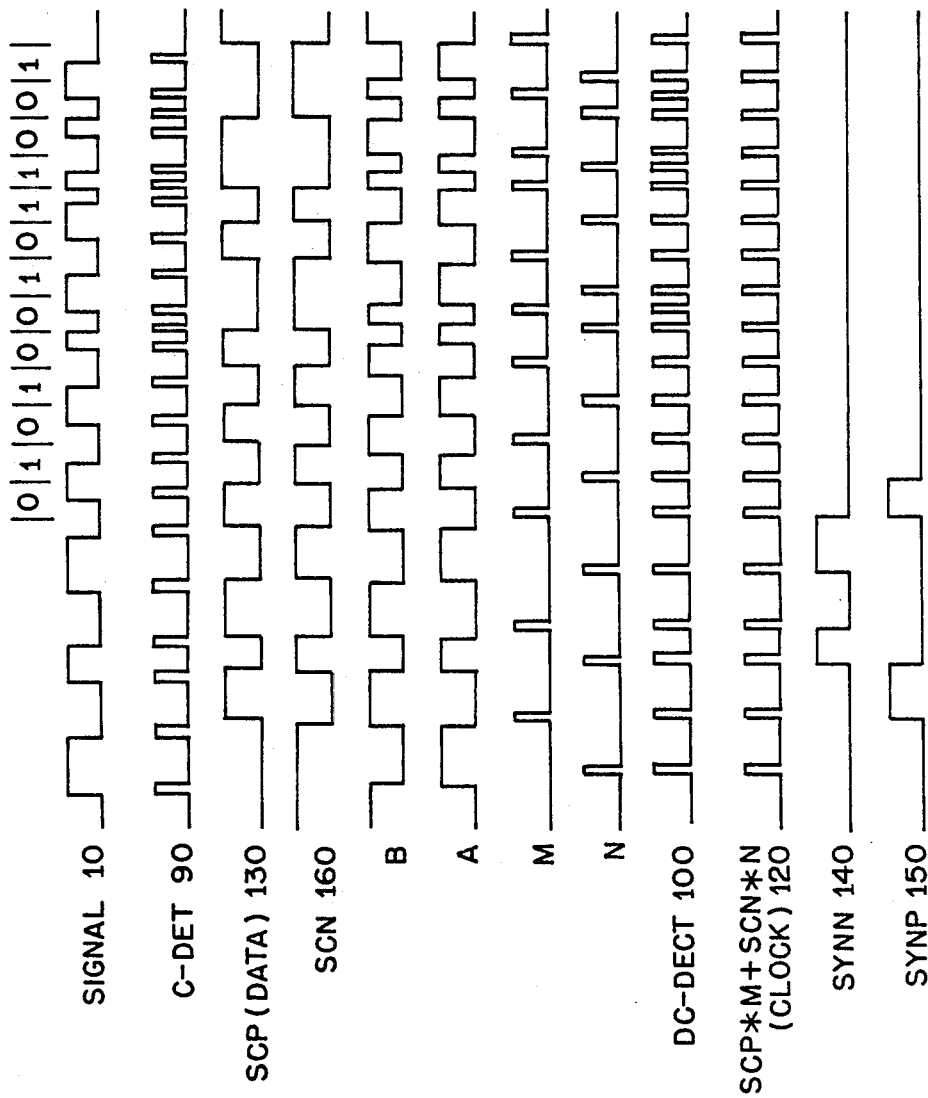
FIG. 3 is a graphical representation of the signal waveforms in the bi-phase decoder apparatus of FIG. 2.

There is shown in FIG. 3 the waveforms for the decoding of a typical Manchester signal by the apparatus of FIG. 2. The other bi-phase signal types can be decoded by changing the combinational logic.

Although the invention has been described with reference to a particular embodiment, it will be understood to those skilled in the art that the invention is capable of a variety of alternative embodiments within the spirit and scope of the appended claims.

What is claimed is:

1. A bi-phase signal detection apparatus comprising in combination:

a delay line to provide a predetermined time delay, said delay line having a plurality of delay taps, said delay line receiving a bi-phase coded signal, said delay line providing a plurality of delayed signals, means for detecting polarity change, said polarity change detecting means receiving said bi-phase coded signal and a first delayed signal from a first delay tap of said delay line, said polarity change detecting means providing a polarity change signal, means for detecting delayed polarity change, said delayed polarity change detecting means receiving a second and third delayed signal from said delay line, said delayed polarity change detecting means providing a delayed polarity change signal, a shift register to receive said plurality of delayed signals from the plurality of delay taps of said delay line, said shift register receiving said polarity change signals from said polarity change detecting means, and a means for decode logic, said decode logic means receiving each signal of said plurality of delayed signals from said shift register and said delayed polarity change signal from said delayed polarity change means, said decode logic means decodes said plurality of delayed signals and provides a data signal, a clock signal, a positive delimiter signals and a negative delimiter signal.

2. A bi-phase signal detection apparatus as described in claim 1 wherein said predetermined time delay comprises 30 nanoseconds and said plurality of delay taps comprises 10 taps.

3. A bi-phase signal detection apparatus as described in claim 1 wherein said polarity change detecting means and said delayed polarity change detecting means respectively comprise an Exclusive Or logic gate.

4. A bi-phase signal detection apparatus as described in claim 1 wherein said shift register comprises a parallel shift register.

5. A bi-phase signal detection apparatus as described in claim 4 wherein said parallel shift register comprises a plurality of parallel flip flops.

* * * * *